(12) United States Patent
Han

(10) Patent No.: US 11,824,144 B2
(45) Date of Patent: Nov. 21, 2023

(54) LIGHT EMITTING DEVICE AND LIGHTING APPARATUS INCLUDING THE SAME

(71) Applicant: SEOUL SEMICONDUCTOR CO., LTD., Gyeonggi-do (KR)

(72) Inventor: Bo Yong Han, Gyeonggi-do (KR)

(73) Assignee: Seoul Semiconductor Co., Ltd., Gyeonggi-do (KR)

( * ) Notice: Subject to any disclaimer, the term of this patent is extended or adjusted under 35 U.S.C. 154(b) by 123 days.

(21) Appl. No.: 17/108,251

(22) Filed: Dec. 1, 2020

(65) Prior Publication Data

US 2021/0167258 A1 Jun. 3, 2021

Related U.S. Application Data

(60) Provisional application No. 62/942,251, filed on Dec. 2, 2019.

(51) Int. Cl.
*H01L 33/50* (2010.01)

(52) U.S. Cl.
CPC .................................. *H01L 33/504* (2013.01)

(58) Field of Classification Search
CPC ..................................................... H01L 33/504
See application file for complete search history.

(56) References Cited

U.S. PATENT DOCUMENTS

| | | | | |
|---|---|---|---|---|
| 2016/0126221 A1* | 5/2016 | Windisch | ............. | H01L 33/504 257/89 |
| 2017/0013909 A1 | 1/2017 | Miller et al. | | |
| 2017/0130909 A1 | 5/2017 | Yeon et al. | | |
| 2018/0139817 A1* | 5/2018 | Yamakawa | ............. | H05B 47/16 |
| 2019/0088832 A1* | 3/2019 | Onuma | ............. | C09K 11/0883 |

FOREIGN PATENT DOCUMENTS

| | | |
|---|---|---|
| KR | 1020100098463 | 9/2010 |
| KR | 1020150035742 | 4/2015 |
| KR | 1020180011191 | 1/2018 |
| WO | 2007001117 | 1/2007 |
| WO | 2014014079 | 1/2014 |

OTHER PUBLICATIONS

International Search Report for International Application PCT/KR2020/017452, dated Apr. 6, 2021.

* cited by examiner

*Primary Examiner* — Sarah K Salerno
(74) *Attorney, Agent, or Firm* — LaBatt, LLC

(57) ABSTRACT

A light emitting device is adapted to realize white light and includes a first light emitting diode chip emitting light having a first peak wavelength in the range of 400 nm to 420 nm, a second light emitting diode chip emitting light having a second peak wavelength in the range of 420 nm to 440 nm, and a wavelength converter covering the first and second light emitting diode chips. The wavelength converter including a blue phosphor, a green phosphor, and a red phosphor. When a maximum value of a spectral power distribution of the light emitting device or a maximum of a reference spectral power distribution of black body radiation is 100%, a difference between the spectral power distribution of the light emitting device and the reference spectral power distribution is less than 20% at each wavelength in the wavelength range of 440 nm to 640 nm.

20 Claims, 6 Drawing Sheets

LIGHT EMITTING DEVICE AND LIGHTING APPARATUS INCLUDING THE SAME

CROSS-REFERENCE TO RELATED APPLICATION AND PRIORITY

The present application is a non-provisional patent application claiming the benefit of and priority to U.S. provisional application No. 62/942,251, filed on Dec. 2, 2019, the disclosure of which is incorporated herein by its entirety.

TECHNICAL FIELD

Embodiments of the present disclosure relate to a light emitting device and a lighting apparatus including the same, and more particularly, to a light emitting device using a light emitting diode as a light source and a lighting apparatus including the same.

BACKGROUND

Most life forms on earth have adapted to work in tune with the sun. The human body has also adapted to sunlight over a long period of time. Accordingly, human circadian biorhythm is known to change with the change of sunlight. Particularly, in the morning, cortisol is secreted from the human body under bright sunlight. Cortisol causes more blood to be supplied to the organs of the body, increasing the pulse and respiration in response to external stimuli, such as stress, thereby causing the body to awaken and prepare for daytime activity. After active physical activity under active sunlight during the daytime, the body secretes melatonin in the evening to reduce the pulse, body temperature and blood pressure of the body, thereby assisting in resting and sleeping.

In modern society, however, most people mainly perform physical activities indoors such as in the home or office settings, instead of under sunlight. It is common that, during the daytime, people commonly spend more time indoors than engaging in physical activity outdoors.

However, indoor lighting apparatuses generally exhibit a constant spectral power distribution that significantly differs from the spectral power distribution of sunlight. For example, although a light emitting apparatus using blue, green and red light emitting diodes can realize white light through combination of a blue color, a green color, and a red color, the light emitting apparatus exhibits a spectral power distribution having a peak at a particular wavelength rather than a spectral power distribution over a broad wavelength spectrum of visible light like sunlight.

FIG. 1 is a graph depicting a spectral power distribution of black body radiation corresponding to several color temperatures on a Planckian locus in the CIE color coordinate system and FIG. 2 is a graph depicting spectral power distributions of white light sources based on typical blue light emitting diode chips corresponding to several correlated color temperatures.

Referring to FIG. 1 and FIG. 2, the spectrum of black body radiation like the sun shows higher intensity in the blue wavelength region with increasing color temperature, as in the spectrum of a typical white light source. However, as color temperature increases, the difference between the spectrum of the white light source and the spectrum of the black body radiation becomes clearer. For example, the spectrum of the black body radiation at a temperature of 6,500K shows that the intensity of light gradually decreases from the blue wavelength region to the red wavelength region. Conversely, as shown in FIG. 2, in the white lighting apparatus based on the blue light emitting diode chips, the intensity of light in the blue wavelength region becomes stronger with increasing color temperature.

The human eye lens adapted to the spectrum of sunlight can be damaged by abnormally strong light in the blue wavelength region, thereby causing poor eyesight. Moreover, when retinal cells are exposed to excessive energy in the blue wavelength region, abnormal signals can be transmitted to the brain, thus abnormally promoting or suppressing generation of hormones, such as cortisol and melatonin. This may have a negative effect on the body's circadian rhythm.

In recent years, various studies have been made to develop a white light source having a similar spectral power distribution to sunlight. In particular, a technique for reducing the intensity of light in the blue wavelength region through combination of a UV or violet light emitting diode and blue, green and red phosphors has been developed. However, the white light source based on such combination causes various drawbacks.

First, luminous efficacy may deteriorate. Since the white light source requires wavelength conversion of light for a greater quantity of phosphors than typical light sources, deterioration in efficiency due to wavelength conversion occurs. Moreover, since the blue phosphor has characteristics of reflecting light, the amount of the blue phosphors is increased in order to obtain the intensity of blue light, thereby causing further deterioration in efficiency of wavelength conversion.

Moreover, light emitted from the green or red phosphors is subjected to wavelength conversion using light having a shorter wavelength than that of light emitted from the blue light emitting diode, thereby causing deterioration in efficiency due to stoke shift.

Deterioration in processability for manufacturing the white light source may occur. As described above, for the white light source using the blue phosphors, the amount of the blue phosphors is increased due to reflection characteristics of the blue phosphors. For example, for the white light source employing the blue light emitting diode, a transparent molding material (for example, silicone) and the phosphors are mixed in a ratio of about 1:1, for the white light source employing the violet light emitting diode, the ratio of the transparent molding material to the phosphors is increased to 1:3. Increase in ratio of the phosphors increases viscosity of a wavelength conversion material in which the transparent molding material is mixed with the phosphors, thereby causing frequent interruption of a dispensing process using a nozzle due to clogging of the nozzle during the process. As a result, the dispensing process may not be applied.

Furthermore, since the ratio of the transparent molding material is relatively decreased, it is difficult for the transparent molding material to block moisture. For example, since silicone acts to prevent moisture infiltration, decrease in the mixed ratio of silicone rapidly deteriorates performance of silicone acting to prevent moisture infiltration. Furthermore, since some blue phosphors are vulnerable to moisture, it is difficult to use the blue phosphors in the white light source.

SUMMARY

Embodiments of the present disclosure provide a light emitting device and a lighting apparatus, which can prevent or relieve damage to the eye lens or retina of a user by light in an abnormal blue wavelength region.

Embodiments of the present disclosure provide a light emitting device and a lighting apparatus, which can automatically change a spectral power distribution corresponding to change in spectral power distribution of sunlight, and can prevent or relieve deterioration in luminous efficacy, processability or reliability.

In accordance with one embodiment of the present invention, a light emitting device is adapted to realize white light and includes: a first light emitting diode chip emitting light having a first peak wavelength in the range of 400 nm to 420 nm; a second light emitting diode chip emitting light having a second peak wavelength in the range of 420 nm to 440 nm; and a wavelength converter covering the first and second light emitting diode chips, the wavelength converter including: a blue phosphor having a peak wavelength in the range of 450 nm to 500 nm; a green phosphor having a peak wavelength in the range of 500 nm to 600 nm; and a red phosphor having a peak wavelength in the range of 600 nm to 650 nm, wherein, assuming that a maximum value of a spectral power distribution of the light emitting device or a maximum value of a reference spectral power distribution of black body radiation is 100%, a difference between the spectral power distribution of the light emitting device and the reference spectral power distribution is less than 20% at each wavelength in the wavelength range of 440 nm to 640 nm.

In accordance with another embodiment of the present invention, a lighting apparatus includes: a base; and a light emitting device disposed on the base, wherein the light emitting device includes: a first light emitting diode chip emitting light having a first peak wavelength in the range of 400 nm to 420 nm; a second light emitting diode chip emitting light having a second peak wavelength in the range of 420 nm to 440 nm; and a wavelength converter covering the first and second light emitting diode chips, the wavelength converter including: a blue phosphor having a peak wavelength in the range of 450 nm to 500 nm; a green phosphor having a peak wavelength in the range of 500 nm to 600 nm; and a red phosphor having a peak wavelength in the range of 600 nm to 650 nm, wherein, assuming that a maximum value of a spectral power distribution of the light emitting device or a maximum value of a reference spectral power distribution of black body radiation is 100%, a difference between the spectral power distribution of the light emitting device and the reference spectral power distribution is less than 20% at each wavelength in the wavelength range of 440 nm to 640 nm.

DETAILED DESCRIPTION OF EMBODIMENTS

Figure 1:
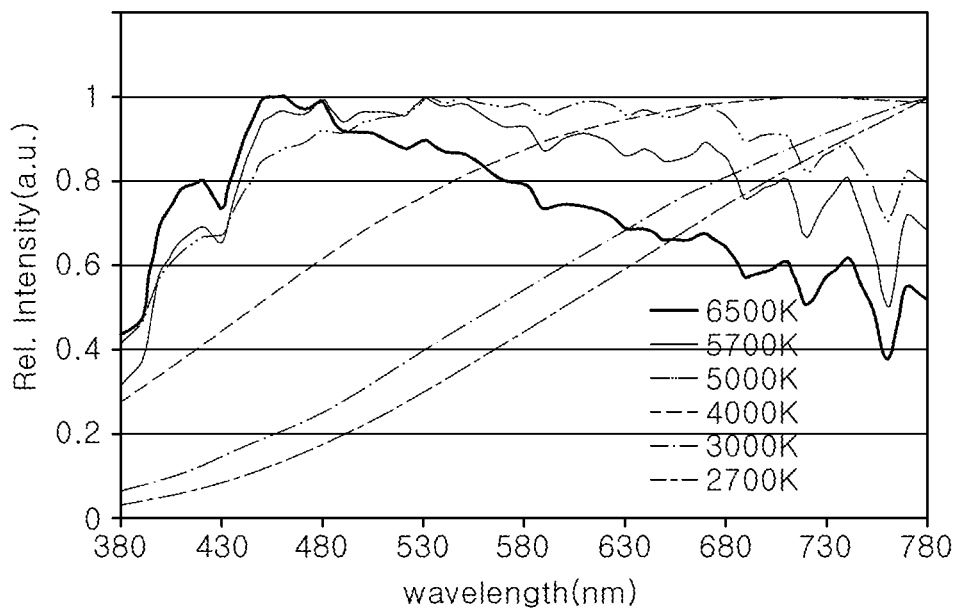
FIG. 1 is a graph depicting a spectral power distribution of black body radiation corresponding to several color temperatures on a Planckian locus in the CIE color coordinate system.
Figure 2:
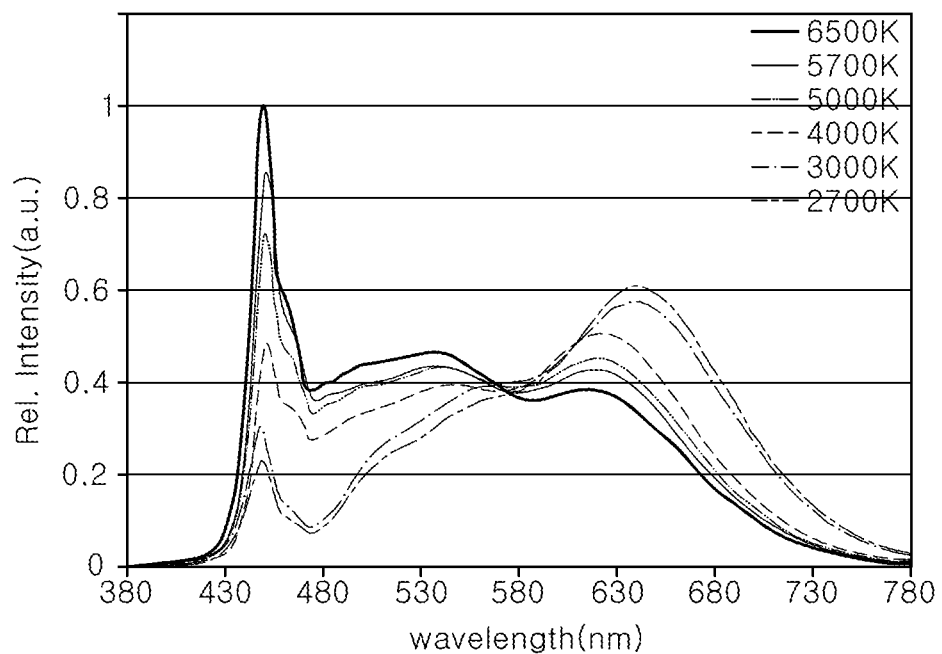
FIG. 2 is a graph depicting spectral power distributions of white light sources based on typical blue light emitting diode chips corresponding to several correlated color temperatures.

Hereinafter, embodiments of the present disclosure will be described in detail with reference to the accompanying drawings. The following embodiments are provided by way of example so as to fully convey the spirit of the present disclosure to those skilled in the art. Accordingly, the present disclosure is not limited to the embodiments disclosed herein and can also be implemented in different forms. In the drawings, widths, lengths, thicknesses, and the like of elements can be exaggerated for clarity and descriptive purposes. Throughout the specification, like reference numerals denote like elements having the same or similar functions.

In accordance with embodiments of the present invention, a light emitting device is adapted to realize white light and includes: a first light emitting diode chip emitting light having a first peak wavelength in the range of 400 nm to 420 nm; a second light emitting diode chip emitting light having a second peak wavelength in the range of 420 nm to 440 nm; and a wavelength converter covering the first and second light emitting diode chips. The wavelength converter includes: a blue phosphor having a peak wavelength in the range of 450 nm to 500 nm; a green phosphor having a peak wavelength in the range of 500 nm to 600 nm; and a red phosphor having a peak wavelength in the range of 600 nm to 650 nm. Assuming that a maximum value of a spectral power distribution of the light emitting device or a maximum value of a reference spectral power distribution of black body radiation is 100%, a difference between the spectral power distribution of the light emitting device and the reference spectral power distribution is less than 20% at each wavelength in the wavelength range of 440 nm to 640 nm.

Hereinafter, unless specifically stated otherwise, certain color coordinates mean color coordinates in the CIE-1931 coordinate system regulated by American National Standards Institute (ANSI). Further, reference spectrum, color rendering index, fidelity index, and graphic index of black body radiation are calculated by IES TM-30-18.

In at least one variant, the light emitting device employs the light emitting diode chips emitting visible light of short wavelengths, thereby preventing damage to the eye lens or retina of a user due to abnormally strong light in the blue wavelength region. Furthermore, the light emitting device employs the first and second light emitting diode chips having different peak wavelengths together, thereby improving luminous efficacy while further improving processability and reliability, as compared with a light emitting device employing the first light emitting diode chip alone.

In another variant, a difference between the first peak wavelength of the first light emitting diode chip and the second peak wavelength of the second light emitting diode chip may be 10 nm or more. Specifically, the first peak wavelength may be in the range of 410 nm to 417.5 nm and the second peak wavelength may be in the range of 430 nm to 437.5 nm.

In further another variant, the light emitting device may have a color temperature of 5,000 K or more.

In some forms, the light emitting device can realize white light having a similar spectral power distribution to sunlight at a color temperature of 5,000 K or more.

In other forms, the light emitting device may have a color temperature of 5,000 K or less.

The light emitting device may further include a third light emitting diode chip emitting light having a third peak wavelength which is longer than the first peak wavelength and is shorter than the second peak wavelength.

In some forms, the light emitting device may further include a blue light emitting diode chip emitting light having a fourth peak wavelength longer than 440 nm. The difference between the spectral power distribution of the light emitting device and the reference spectral power distribution is maintained to be less than 20% even at the fourth peak wavelength.

The light emitting device may have a rendering index of 95 or more and a fidelity index of 95 or more. Further, the light emitting device may have a graphic index in the range of 95 to 105.

The blue phosphor may include BAM, aluminate, halophosphate or silicate based phosphors. In particular, the aluminate based phosphor exhibits strong moisture resistance, thereby improving reliability of the light emitting device.

In accordance with another embodiment of the present invention, a lighting apparatus includes: a base; and a light emitting device disposed on the base, wherein the light emitting device includes: a first light emitting diode chip emitting light having a first peak wavelength in the range of 400 nm to 420 nm; a second light emitting diode chip emitting light having a second peak wavelength in the range of 420 nm to 440 nm; and a wavelength converter covering the first and second light emitting diode chips. The wavelength converter includes a blue phosphor having a peak wavelength in the range of 450 nm to 500 nm; a green phosphor having a peak wavelength in the range of 500 nm to 600 nm; and a red phosphor having a peak wavelength in the range of 600 nm to 650 nm. When a maximum value of a spectral power distribution of the light emitting device or a maximum value of a reference spectral power distribution of black body radiation is 100%, a difference between the spectral power distribution of the light emitting device and the reference spectral power distribution is less than 20% at each wavelength in the wavelength range of 440 nm to 640 nm.

In at least one variant, multiple light emitting devices may be disposed on the base and may emit white light having different color temperatures.

Hereinafter, various embodiments of the present disclosure will be described with reference to the accompanying drawings.

Figure 3:
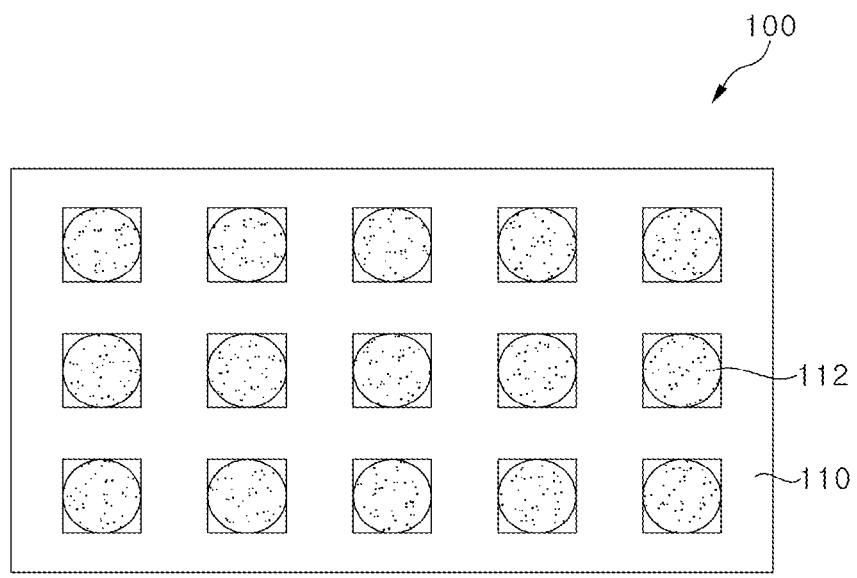
FIG. 3 is a schematic plan view of a lighting apparatus according to embodiments of the present disclosure.
Figure 4:
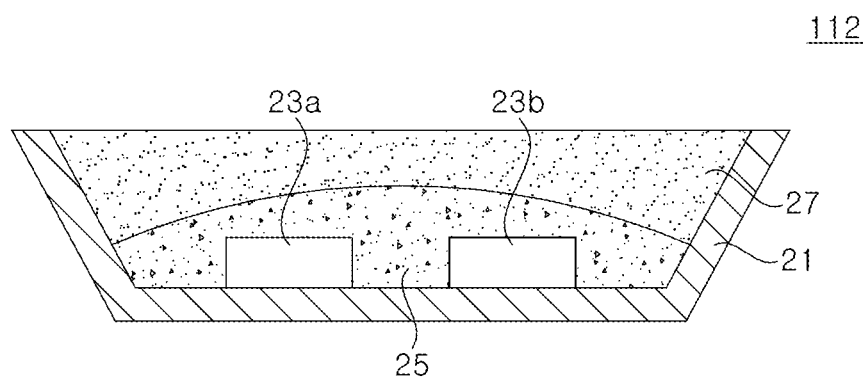
FIG. 4 is a schematic sectional view of a light emitting device according to embodiments of the present disclosure.
Figure 5A:
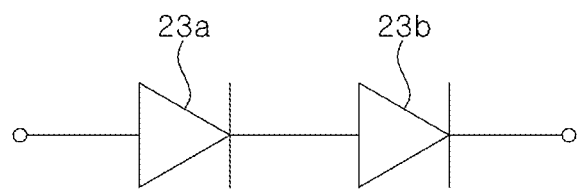
FIG. 5A is a schematic circuit diagram of the light emitting device according to embodiments of the present disclosure.
Figure 5B:
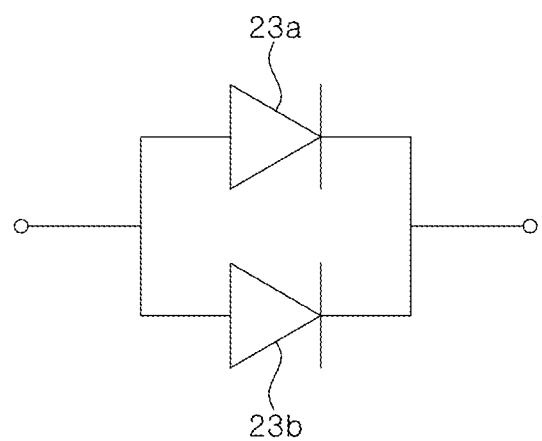
FIG. 5B is a schematic circuit diagram of a light emitting device according to embodiments of the present disclosure.

FIG. 3 is a schematic plan view of a lighting apparatus according to embodiments of the present disclosure and FIG. 4 is a schematic sectional view of a light emitting device shown in FIG. 3.

Referring to FIG. 3, the lighting apparatus includes a base 110 and light emitting devices 112 disposed on the base 110. Like a printed circuit board, the base 110 may include a circuit wire for supplying power to the light emitting devices 122. Further, an integrated circuit element may be mounted on the base 110.

The light emitting devices 112 are arranged on the base 110. Although the lighting apparatus includes multiple light emitting devices 112, it should be understood that other implementations are possible and a single light emitting device 122 may be disposed on the base 110. In addition, the light emitting devices 112 emitting light having the same color temperature may be disposed on the base 110. However, it should be understood that other implementations are possible and light emitting devices emitting light having different color temperatures may be disposed thereon. Accordingly, the lighting apparatus may realize white light having various color temperatures.

Referring to FIG. 4, the light emitting device 112 may include a housing 21, light emitting diode chips 23a, 23b, a wavelength converter 25, and a molding portion 27. The housing 21 has leads for electrical connection and may have a cavity.

The light emitting diode chips 23a, 23b may be disposed in the cavity of the housing 21 to be electrically connected to the leads. The light emitting diode chips 23a, 23b may be horizontal light emitting diode chips, without being limited thereto. Alternatively, the light emitting diode chips 23a, 23b may be vertical or flip-chip type light emitting diodes.

The first light emitting diode chip 23a and the second light emitting diode chip 23b may emit light having a shorter wavelength than blue light. The first light emitting diode chip may emit light having a peak wavelength in the range of 400 nm to 420 nm, more specifically about 410 nm to about 417.5 nm, and the second light emitting diode chip 23b may emit light having a peak wavelength in the range of about 420 nm to about 440 nm, more specifically 430 nm to 437.5 nm. Furthermore, the light emitted from the second light emitting diode chip 23b may have a greater peak wavelength than the light emitted from the first light emitting diode chip 23a by about 10 nm or more.

The first light emitting diode chip 23a and the second light emitting diode chip 23b are used together as light sources for wavelength conversion. Thus, as compared with a light emitting device using the first light emitting diode chip 23a alone, the light emitting device 112 can improve luminous efficacy while reducing the amount of blue phosphors by adopting the second light emitting diode chip 23b together with the first light emitting diode chip. In addition, as compared with the light emitting device using the second light emitting diode chip 23b alone, the light emitting device 112 can reduce the intensity of the peak wavelength of the light emitted from the second light emitting diode chip 23b, thereby realizing a similar spectral power distribution to sunlight by adopting the first light emitting diode chip 23a together with the second light emitting diode chip 23b.

The wavelength converter 25 may be disposed in the cavity of the housing 21 to cover the light emitting diode chips 23. The wavelength converter 25 converts light emitted from the light emitting diode chips 23 into light having a longer wavelength.

The wavelength converter 25 may include three kinds of phosphors. The light emitting device 112 may emit light having a desired color temperature using the light emitting diode chips 23a, 23b and the wavelength converter 25.

The wavelength converter 25 may include, for example, blue phosphors, green phosphors, yellow phosphors, or red phosphors. The blue phosphors may include BAM, halo-phosphate, silicate or aluminate-based phosphors, for example, $BaMgAl_{10}O_{17}:Mn^{2+}$, $BaMgAl_{12}O_{19}:Mn^{2+}$ or $(Sr,Ca,Ba)PO_4Cl:Eu^{2+}$. In particular, the aluminate-based phosphors exhibit good humidity resistance and thus are suitable for the light emitting device 112. The blue phosphors may have a peak wavelength in the range of, for example, 440 nm to 500 nm.

The green or yellow phosphors may include, for example, $LuAG(Lu_3(Al,Gd)_5O_{12}:Ce^{3+})$, $YAG(Y_3(Al,Gd)_5O_{12}:Ce^{3+})$, Ga-LuAG$((Lu,Ga)_3(Al,Gd)_5O_{12}:Ce^{3+})$, Ga-YAG $((Ga,Y)_3(Al,Gd)_5O_{12}:Ce^{3+})$, LuYAG $((Lu,Y)_3(Al,Gd)_5O_{12}:Ce^{3+})$, ortho-Silicate $((Sr,Ba,Ca,Mg)_2SiO_4:Eu^{2+})$, oxynitride $((Ba,Sr,Ca)Si2O2N2:Eu^{2+})$, or thiogallate $(SrGa_2S_4:Eu^{2+}+)$. In addition, other kinds of green or yellow phosphors may be used. The green or yellow phosphors may have a peak wavelength in the range of, for example, 500 nm to 600 nm.

The red phosphors may include, for example, nitride, sulfide, fluoride or oxynitride-based phosphors, specifically CASN $(CaAlSiN_3:Eu^{2+})$, $(Ba,Sr,Ca)_2Si_5N_8:Eu^{2+}$, $(Ca,Sr)S_2:Eu^{2+}$), or $(Sr,Ca)_2SiS_4:Eu^{2+}$. In addition, other kinds of red phosphors may be used. The red phosphors may have a peak wavelength in the range of, for example, 600 nm to 700 nm.

The wavelength converter 25 may have a structure in which the phosphors are dispersed in a transparent molding material. The transparent molding material may include, for example, silicone, epoxy, or glass. In some embodiments, the phosphors may have a particle size of about 15 µm or less to secure stability of a dispensing process.

The molding portion 27 may be formed in the cavity of the housing 21 to cover the wavelength converter 25. The molding portion 27 is formed of a light transmissive material. In particular, the molding portion 27 may be formed of methyl or phenyl-based silicone, specifically phenyl-based silicone. Although the phenyl-based silicone is likely to suffer from yellowing due to UV light, the phenyl-based silicone exhibits higher strength than the methyl-based silicone. Although the molding portion 27 is used to prevent moisture permeation, the molding portion 27 may be omitted.

Although the light emitting device 112 is illustrated as including the housing 21 in this embodiment, it should be understood that the present disclosure is not limited to a particular structure of the housing 21. The light emitting device 112 may have any structure corresponding to use conditions so long as the structure of the light emitting device includes the light emitting diode chips 23a, 23b and the wavelength converter 25.

In the meantime, according to this embodiment, the light emitting device 112 has a similar spectral power distribution to sunlight by adopting the first and second light emitting diode chips 23a, 23b emitting light having a peak wavelength of less than 440 nm. In particular, comparing the spectral power distribution of the light emitting device 112 with the reference spectral power distribution of black body radiation in accordance with ISE TM-30-18, a difference between the spectral power distribution of the light emitting device 112 in the wavelength range of 440 nm to 640 nm and the reference spectral power distribution may be less than 20%, specifically less than 10%, at a color temperature of 6,000 K or more. Since a typical white light emitting device has higher intensity of blue light at a wavelength of 440 nm or more, the typical white light emitting device may not satisfy a difference of less than 20% in spectral power distribution between the light emitting device and the blackbody radiation at a high color temperature of 6,000 K or more.

In particular, the light emitting device 112 according to this embodiment may have a rendering index of 95 or more, a fidelity index of 95 or more, and a graphic index of 95 to 105, thereby exhibiting a very similar spectral power distribution to sunlight.

FIG. 6 to FIG. 10 are graphs depicting spectra of light emitting devices according to embodiments of the present disclosure and spectra of black body radiation (reference light source) at color temperatures corresponding thereto. In these embodiments, the first light emitting diode chip 23a has a peak wavelength of about 412.5 nm and the second light emitting diode chip 23b has a peak wavelength of 435 nm. The color temperature of the light emitting device may be regulated by regulating the mixed ratio of the blue phosphors, the green phosphors and the red phosphors.

Figure 6:
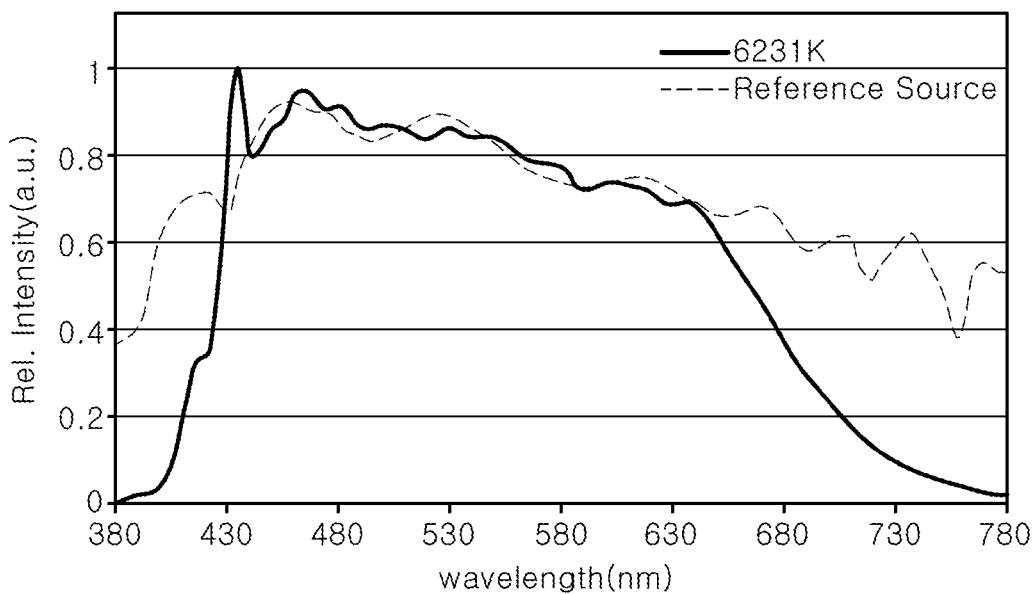
FIG. 6 is a graph depicting spectrum of light emitting devices according to embodiments of the present disclosure and spectrum of black body radiation (reference light source) at color temperature of 6231K.

The light emitting device of FIG. 6 has a color temperature of about 6,231 K and a rendering index Ra of 99.2. In addition, the light emitting device has a fidelity index of 97.1 and a graphic index Rg of 99.6, as calculated by IES TM-30-18. Thus, it can be seen that the light emitting device according to this embodiment has a relatively high color temperature, a high rendering index of 95 or more, a high fidelity index of 95 or more, and a graphic index approaching 100, thereby realizing white light similar to sunlight.

In particular, referring to FIG. 6, it can be seen that the light emitting device exhibits higher intensity of light emitted from the second light emitting diode chip 23b at the peak wavelength thereof than the reference spectrum while exhibiting a substantially similar spectral power distribution to the reference spectral power distribution in the wavelength range of 440 nm to 640 nm. That is, the maximum value of the spectral power distribution of the light emitting device or the maximum value of the reference spectral power distribution is 100%, and the difference between the spectral power distribution of the light emitting device and the reference spectral power distribution is less than 10% in the wavelength range of 440 nm to 640 nm.

Figure 7:
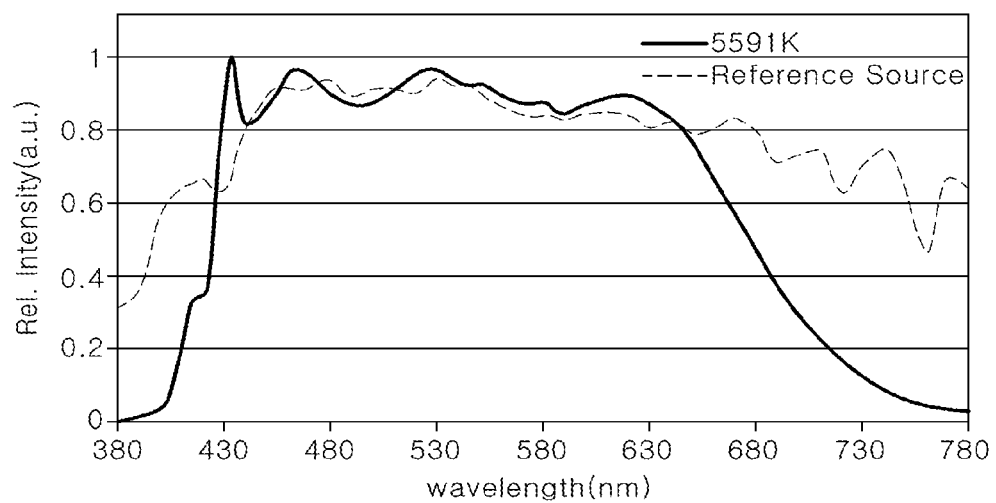
FIG. 7 is a graph depicting spectrum of light emitting devices according to embodiments of the present disclosure and spectrum of black body radiation (reference light source) at color temperature of 5591K.

The light emitting device of FIG. 7 has a color temperature of about 5,591 K and a rendering index Ra of 98.5. In addition, the light emitting device has a fidelity index of 97.7 and a graphic index Rg of 100.6, as calculated by IES TM-30-18. Thus, it can be seen that the light emitting device according to this embodiment has a relatively high color temperature of 5,500 K or more, a high rendering index of 95 or more, a high fidelity index of 95 or more, and a graphic index approaching 100, thereby realizing white light similar to sunlight.

In particular, referring to FIG. 7, it can be seen that the light emitting device exhibits higher intensity of light emitted from the second light emitting diode chip 23b at the peak wavelength thereof than the reference spectrum while exhibiting a substantially similar spectral power distribution to the reference spectral power distribution in the wavelength range of 440 nm to 640 nm. That is, when the maximum value of one of the spectral power distribution of the light emitting device and the reference spectral power distribution is 100%, the difference between the spectral power distribution of the light emitting device and the reference spectral power distribution is less than 10% in the wavelength range of 440 nm to 640 nm.

Figure 8:
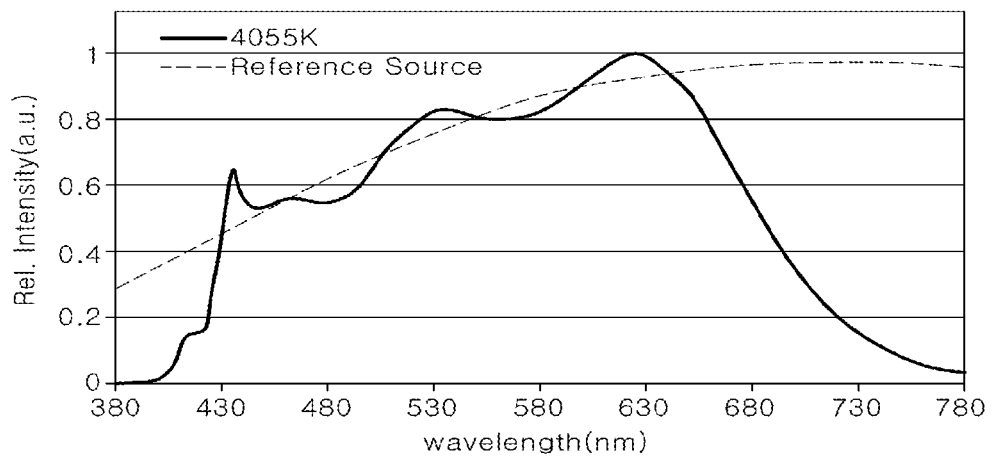
FIG. 8 is a graph depicting spectrum of light emitting devices according to embodiments of the present disclosure and spectrum of black body radiation (reference light source) at color temperature of 4055K.

The light emitting device of FIG. 8 has a color temperature of about 4,055 K and a rendering index Ra of 98.7. In addition, the light emitting device has a fidelity index of 97.0 and a graphic index Rg of 100.3, as calculated by IES TM-30-18. Thus, it can be seen that the light emitting device according to this embodiment has a high rendering index of 95 or more, a high fidelity index of 95 or more, and a graphic index approaching 100, thereby realizing white light similar to sunlight.

In particular, referring to FIG. 8, it can be seen that the light emitting device exhibits higher intensity of light emitted from the second light emitting diode chip 23b at the peak wavelength thereof than the reference spectrum while exhibiting a substantially similar spectral power distribution to the reference spectral power distribution in the wavelength range of 440 nm to 640 nm. That is, the maximum value of one of the spectral power distribution of the light emitting device and the reference spectral power distribution is 100%, and the difference between the spectral power distribution of the light emitting device and the reference spectral power distribution is less than 10% in the wavelength range of 440 nm to 640 nm.

Figure 9:
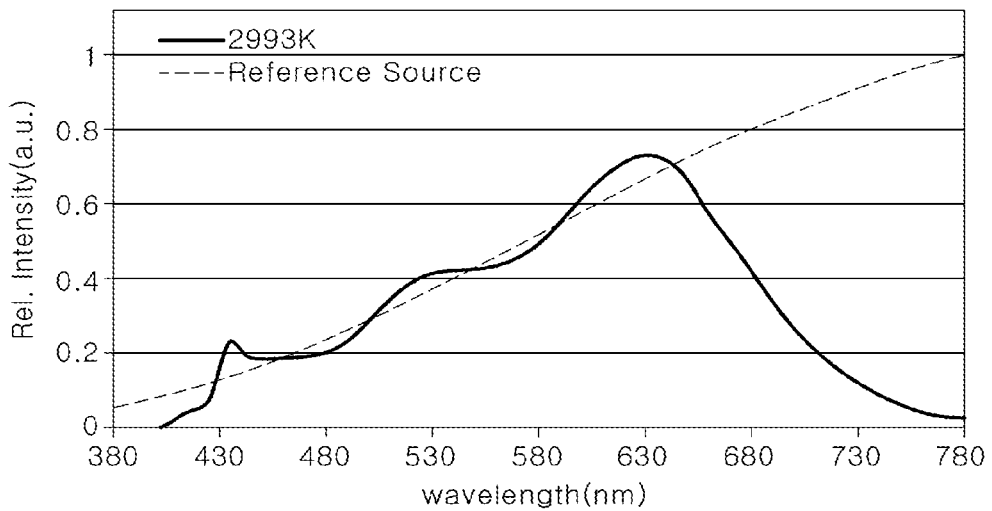
FIG. 9 is a graph depicting spectrum of light emitting devices according to embodiments of the present disclosure and spectrum of black body radiation (reference light source) at color temperature of 2993K.

The light emitting device of FIG. 9 has a color temperature of about 2,993 K and a rendering index Ra of 97.3. In addition, the light emitting device has a fidelity index of 96.1 and a graphic index Rg of 101.9, as calculated by IES TM-30-18. Thus, it can be seen that the light emitting device according to this embodiment has a high rendering index of 95 or more, a high fidelity index of 95 or more, and a graphic index approaching 100, thereby realizing white light similar to sunlight.

In particular, referring to FIG. 9, it can be seen that the light emitting device exhibits higher intensity of light emitted from the second light emitting diode chip 23b at the peak wavelength thereof than the reference spectrum while exhibiting a substantially similar spectral power distribution to the reference spectral power distribution in the wavelength range of 440 nm to 640 nm. That is, when the maximum value of the spectral power distribution of the light emitting device or the maximum value of the reference spectral power distribution is 100%, the difference between the spectral power distribution of the light emitting device and the reference spectral power distribution is less than 10% in the wavelength range of 440 nm to 640 nm.

Figure 10:
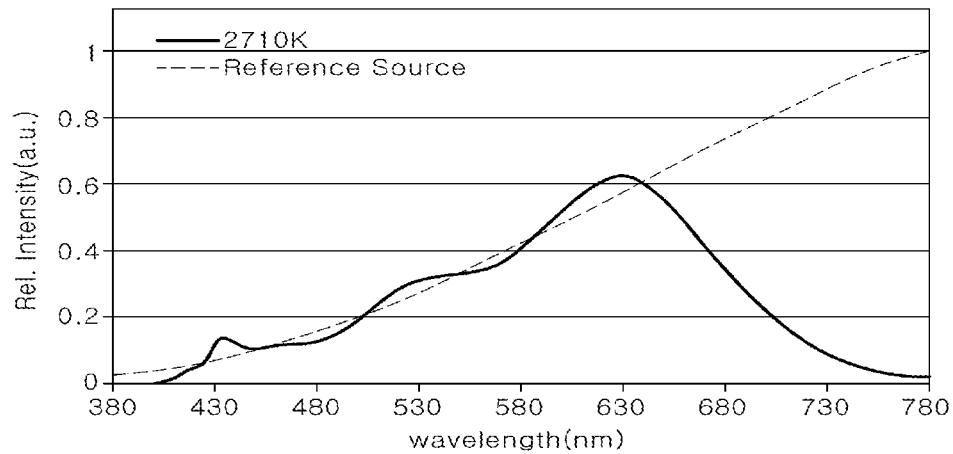
FIG. 10 is a graph depicting spectrum of light emitting devices according to embodiments of the present disclosure and spectrum of black body radiation (reference light source) at color temperature of 2710K.

The light emitting device of FIG. 10 has a color temperature of about 2,710 K and a rendering index Ra of 97.3. In addition, the light emitting device has a fidelity index of 95.1 and a graphic index Rg of 101.4, as calculated by IES TM-30-18. Thus, it can be seen that the light emitting device according to this embodiment has a high rendering index of 95 or more, a high fidelity index of 95 or more, and a graphic index approaching 100, thereby realizing white light similar to sunlight.

In particular, referring to FIG. 10, it can be seen that the light emitting device exhibits higher intensity of light emitted from the second light emitting diode chip 23b at the peak wavelength thereof than the reference spectrum while exhibiting a substantially similar spectral power distribution to the reference spectral power distribution in the wavelength range of 440 nm to 640 nm. That is, when the maximum value of one of the spectral power distribution of the light emitting device and the reference spectral power distribution is 100%, the difference between the spectral power distribution of the light emitting device and the reference spectral power distribution is less than 10% in the wavelength range of 440 nm to 640 nm.

Referring to FIG. 6 to FIG. 10, it can be seen that the spectrum of light emitted from the light emitting device at various color temperatures substantially matches the spectrum of black body radiation in the visible range by adopting the first light emitting diode chip 23a and the second light emitting diode chip 23b. In particular, the light emitting devices according to these embodiments exhibit not only good rendering index but also good fidelity index and good graphic index at high color temperatures, thereby realizing light similar to sunlight.

Figure 11:
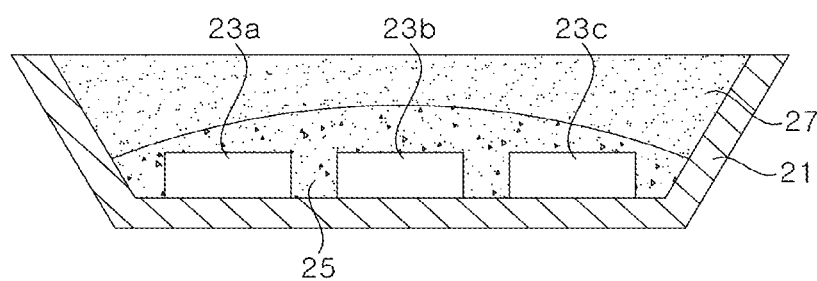
FIG. 11 is a schematic sectional view of a light emitting device according to a further embodiment of the present disclosure.

FIG. 11 is a schematic sectional view of a light emitting device 112a according to another embodiment of the present disclosure.

Referring to FIG. 11, the light emitting device 112a according to this embodiment is generally similar to the light emitting devices 112 described with reference to FIG. 4 and further includes a third light emitting diode chip 23c.

The third light emitting diode chip 23c emits light having a peak wavelength between the peak wavelength of light emitted from the first light emitting diode chip 23a and the peak wavelength of light emitted from the second light emitting diode chip 23b. For example, the third light emitting diode chip 23c may have a peak wavelength in the range of 410 nm to 430 nm. By adopting the third light emitting diode chip 23c, the light emitting device can reduce the intensity of light emitted from the second light emitting diode chip 23b at the peak wavelength thereof.

Although the light emitting device 112a is illustrated as including three light emitting diode chips, that is, the first to third light emitting diode chips 23a, 23b, 23c in this embodiment, the light emitting device may include a greater number of light emitting diode chips. That is, in addition to the third light emitting diode chip 23c, the light emitting device may further include other light emitting diode chips emitting light having a peak wavelength between the peak wavelength of the light emitted from the first light emitting diode chip 23a and the peak wavelength of the light emitted from the second light emitting diode chip 23b.

In the above-described embodiments, although the first to third light emitting diode chips 23a, 23b, 23c are illustrated as emitting light having peak wavelengths of 440 nm or less, the light emitting device may further include a blue light emitting diode chip so long as the spectral power distribution of the light emitting device does not deviate 10% or more from the reference spectral power distribution in the wavelength range of 440 nm to 640 nm, thereby further improving luminous efficacy.

Although various embodiments have been described herein, it should be understood that these embodiments are given by way of illustration only and that various modifications, variations, and alterations can be made without departing from the spirit and scope of the present disclosure. In particular, a feature or component of one embodiment can also be applied to other embodiments without departing from the spirit and scope of the present disclosure.

The invention claimed is:

1. A light emitting module, comprising:
   a base having a circuit wire;
   a circuit device disposed on the base; and
   a plurality of light emitting devices disposed on the base, wherein the plurality of light emitting devices includes at least two light emitting devices that emit light having different color temperatures, and wherein each of the at least two light emitting devices includes:
   a first light emitter emitting a first light having a first peak wavelength;
   a second light emitter emitting a second light having a second peak wavelength different from the first peak wavelength, wherein the second peak wavelength is in the range of 420 nm to 440 nm; and a wavelength conversion layer including at least three kinds of wavelength converters, wherein the wavelength conversion layer is configured to convert the first and second light emitted from the first and second light emitters into a third light;

wherein each of the at least two light emitting devices emits a fourth light having a spectral power distribution produced by a combination of the first light, the second light, and the third light;

wherein the second peak wavelength of the second light in the spectral power distribution has higher intensity than a reference spectral power distribution of black body radiation, wherein the first peak wavelength of the first light in the spectral power distribution has lower intensity than the second peak wavelength of the second light in the spectral power distribution, and wherein, when one of a maximum value of the spectral power distribution of the fourth light or a maximum value of a reference spectral power distribution of black body radiation is 100%, a difference between the spectral power distribution of the fourth light and the reference spectral power distribution is less than 20% at each wavelength in the wavelength range of 440 nm to 640 nm.

2. The light emitting module according to claim 1, wherein a difference between the first peak wavelength of the first light and the second peak wavelength of the second light is 10 nm or more.

3. The light emitting module according to claim 2, wherein, when one of the maximum value of the spectral power distribution of the fourth light or the maximum value of the reference spectral power distribution of black body radiation is 100%, the difference between the spectral power distribution of the fourth light and the reference spectral power distribution is less than 10% at each wavelength in the wavelength range of 440 nm to 640 nm.

4. The light emitting module according to claim 1, wherein at least one of the at least two light emitting devices emits light having a color temperature of 5,000 K or more.

5. The light emitting module according to claim 1, wherein at least one of the at least two light emitting devices emits light having a color temperature of 5,000 K or less.

6. The light emitting module according to claim 1, wherein at least one of the at least two light emitting devices includes further includes a third light emitter emitting light having a third peak wavelength that is longer than the first peak wavelength.

7. The light emitting module according to claim 6, wherein the third peak wavelength is longer than 440 nm.

8. The light emitting module according to claim 1, wherein at least one of the at least two light emitting devices has a rendering index that is 95 or more.

9. The light emitting module according to claim 8, wherein the light emitting device the at least one of the at least two light emitting devices has a graphic index in the range of 95 to 105.

10. The light emitting module according to claim 1, wherein at least one of the at least two light emitting devices has a fidelity index that is 95 or more.

11. A lighting apparatus comprising:
a base having a wire circuit;
a circuit device disposed on the base; and
a light emitting device disposed on the base, the light emitting device comprising:
a first light emitter emitting light having a first peak wavelength;
a second light emitter emitting light having a second peak wavelength different from the first peak wavelength; and
a wavelength conversion layer including at least three kinds of wavelength converters, wherein the wavelength conversion layer is configured to convert the first and second light emitted from the first and second light emitters into a third light;

wherein at least one of the wavelength converters comprises a phosphor having a particle size of about 15 μm or less;

wherein at least one of the wavelength converters has a high humidity resistance;

wherein the light emitting device emits a fourth light having a spectral power distribution produced by a combination of the first light, the second light, and the third light;

wherein the second peak wavelength of the second light in the spectral power distribution has higher intensity than a reference spectral power distribution of black body radiation; and wherein, when one of a maximum value of the spectral power distribution of the fourth light or a maximum value of the reference spectral power distribution of black body radiation is 100%, a difference between the spectral power distribution of the fourth light and the reference spectral power distribution is less than 20% at each wavelength in the wavelength range of 440 nm to 640 nm.

12. The lighting apparatus according to claim 11, further comprising at one additional light emitting device disposed on the base, the plurality of light emitting devices disposed on the base comprising light emitting devices emitting white light having different color temperatures.

13. The lighting apparatus according to claim 11, wherein a difference between the first peak wavelength and the second peak wavelength is 10 nm or more.

14. The lighting apparatus according to claim 13, wherein, when one of the maximum value of the spectral power distribution of the fourth light or the maximum value of the reference spectral power distribution of black body radiation is 100%, the difference between the spectral power distribution of the fourth light and the reference spectral power distribution is less than 10% at each wavelength in the wavelength range of 440 nm to 640 nm.

15. The lighting apparatus according to claim 11, wherein the light emitting device emits light having a color temperature of 5,000 K or more.

16. The lighting apparatus according to claim 11, wherein the light emitting device emits light having a color temperature of 5,000 K or less.

17. The lighting apparatus according to claim 11, wherein the light emitting device further comprises a third light emitting diode chip emitting light having a third peak wavelength that is longer than the first peak wavelength.

18. The lighting apparatus according to claim 11, wherein the light emitting device has a rendering index that is 95 or more.

19. The lighting apparatus according to claim 18, wherein the light emitting device has a graphic index in the range of 95 to 105.

20. The lighting apparatus according to claim 11, wherein the light emitting device has a fidelity index that is 95 or more.

* * * * *